(12) United States Patent
Nishigaki et al.

(10) Patent No.: US 7,777,592 B2
(45) Date of Patent: Aug. 17, 2010

(54) ANTENNA SHARING DEVICE AND PORTABLE TELEPHONE

(75) Inventors: Michihiko Nishigaki, Kawasaki (JP); Ryoichi Ohara, Kawasaki (JP); Minoru Kawase, Yokohama (JP); Kazuhiko Itaya, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 408 days.

(21) Appl. No.: 11/689,848

(22) Filed: Mar. 22, 2007

(65) Prior Publication Data
US 2007/0222540 A1 Sep. 27, 2007

(30) Foreign Application Priority Data
Mar. 24, 2006 (JP) .............................. 2006-083719

(51) Int. Cl.
*H03H 9/72* (2006.01)
(52) U.S. Cl. ...................................... 333/133; 333/193
(58) Field of Classification Search ................. 333/133, 333/193
See application file for complete search history.

(56) References Cited

U.S. PATENT DOCUMENTS

| | | | | |
|---|---|---|---|---|
| 6,222,426 B1* | 4/2001 | Komazaki et al. | ............ | 333/133 |
| 6,756,864 B2* | 6/2004 | Muramatsu | ................. | 333/133 |
| 6,909,338 B2* | 6/2005 | Omote | ........................ | 333/133 |
| 7,339,445 B2* | 3/2008 | Aigner et al. | ................ | 333/133 |
| 2007/0030096 A1* | 2/2007 | Nishihara et al. | ........... | 333/133 |

FOREIGN PATENT DOCUMENTS

| | | |
|---|---|---|
| JP | 05-167388 | 7/1993 |
| JP | 09-098046 | 4/1997 |
| JP | 10-313229 | 11/1998 |
| JP | 2000-022495 | 1/2000 |
| JP | 2001-024476 | 1/2001 |
| JP | 2003-179518 | 6/2003 |
| JP | 2004-080233 | 3/2004 |
| JP | 2005-072805 | 3/2005 |
| JP | 2005-102114 | 4/2005 |
| JP | 2005-204252 | 7/2005 |
| JP | 2005-333644 | 12/2005 |
| WO | 2005/088833 | 9/2005 |

OTHER PUBLICATIONS

Japanese Office Action for 2006-083719 mailed on Jun. 4, 2010.

* cited by examiner

*Primary Examiner*—Benny Lee
*Assistant Examiner*—Alan Wong
(74) *Attorney, Agent, or Firm*—Turocy & Watson, LLP

(57) ABSTRACT

An antenna sharing device has a common signal terminal pair, a first terminal pair, a second terminal pair, a first filter, a second filter, a first inductor element, second inductor elements, third inductor elements. The second and third inductor elements have a plurality of inductor elements, respectively. An inductor element closest to the first terminal pair among the inductor elements included in the second inductor elements and an inductor element closest to the second terminal pair among the third inductor elements are arranged further away from the first inductor element than the other inductor elements included in the second and third inductor elements, or formed on a substrate different from a substrate on which the first inductor element is formed, or formed opposite to the first inductor element by sandwiching a shielding pattern.

12 Claims, 11 Drawing Sheets

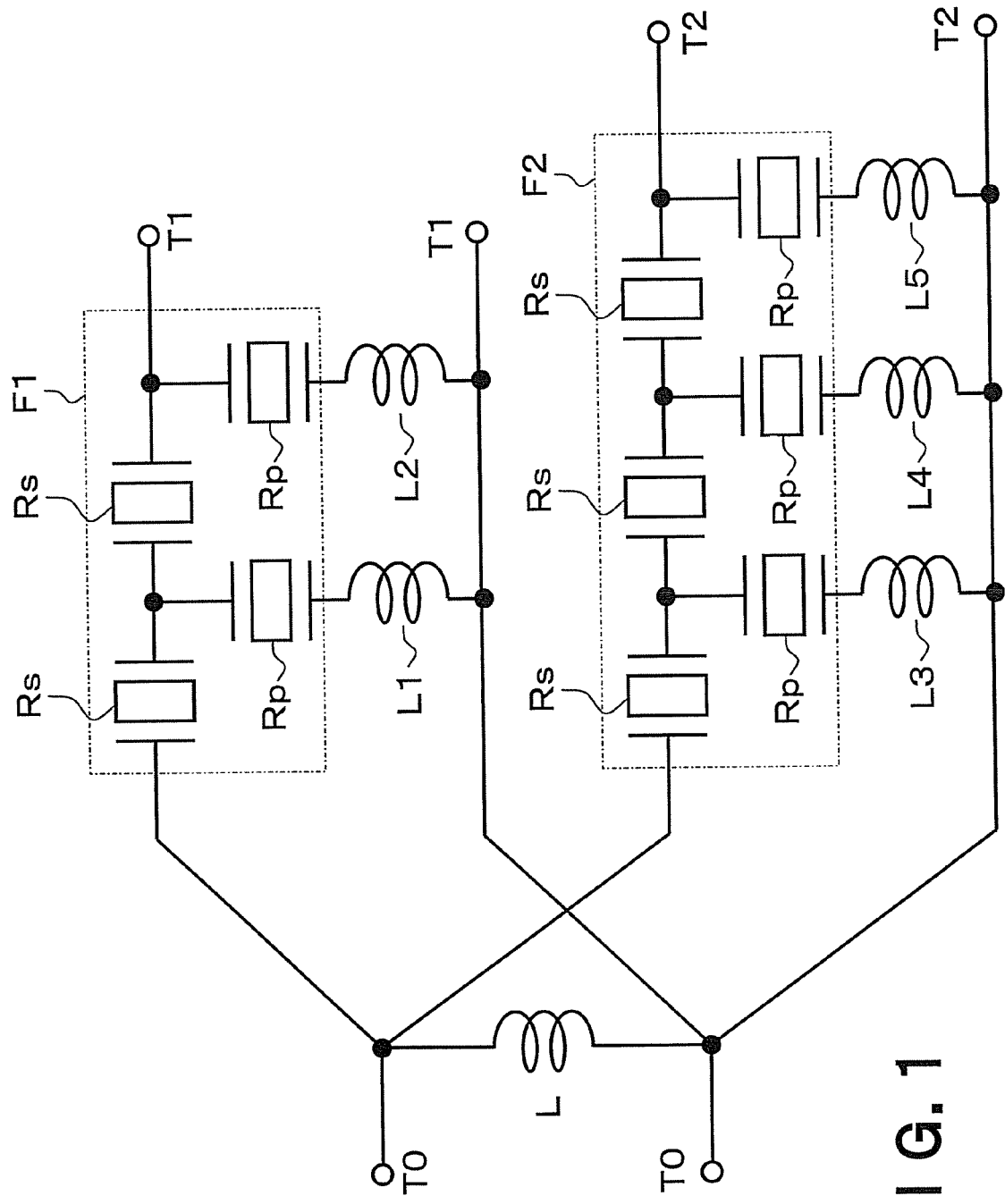
F I G. 1

|   | L | L1 | L2 | L3 | L4 | L5 |
|---|---|---|---|---|---|---|
| L |   | ILT=3.7dB<br>IST=3.7dB<br>ILR=0.0dB<br>ISR=0.0dB | ILT=23.8dB<br>IST=23.8dB<br>ILR=0.0dB<br>ISR=0.0dB | ILT=0.0dB<br>IST=0.0dB<br>ILR=5.5dB<br>ISR=5.5dB | ILT=0.0dB<br>IST=0.0dB<br>ILR=14.9dB<br>ISR=14.9dB | ILT=0.0dB<br>IST=0.0dB<br>ILR=44.5dB<br>ISR=44.5dB |
| L1 |   |   | ILT=11.2dB<br>IST=11.2dB<br>ILR=0.0dB<br>ISR=0.0dB | ILT=1.0dB<br>IST=1.4dB<br>ILR=-4.2dB<br>ISR=5.9dB | ILT=0.0dB<br>IST=0.4dB<br>ILR=4.3dB<br>ISR=11.4dB | ILT=1.0dB<br>IST=0.1dB<br>ILR=38.5dB<br>ISR=41.0dB |
| L2 |   |   |   | ILT=13.6dB<br>IST=14.7dB<br>ILR=-6.0dB<br>ISR=5.2dB | ILT=6.8dB<br>IST=8.8dB<br>ILR=-2.2dB<br>ISR=9.8dB | ILT=12.0dB<br>IST=15.0dB<br>ILR=35.8dB<br>ISR=37.8dB |
| L3 |   |   |   |   | ILT=0.0dB<br>IST=0.0dB<br>ILR=6.6dB<br>ISR=6.6dB | ILT=0.0dB<br>IST=0.0dB<br>ILR=37.4dB<br>ISR=37.4dB |
| L4 |   |   |   |   |   | ILT=0.0dB<br>IST=0.0dB<br>ILR=7.1dB<br>ISR=7.1dB |
| L5 |   |   |   |   |   |   |

FIG. 6

ANTENNA SHARING DEVICE AND PORTABLE TELEPHONE

CROSS REFERENCE TO RELATED APPLICATIONS

This application is based upon and claims the benefit of priority from the prior Japanese Patent Application No. 2006-83719, filed on Mar. 24, 2006, the entire contents of which are incorporated herein by reference.

BACKGROUND OF THE INVENTION

1. Field of the Invention

The present invention relates to an antenna sharing device provided with piezoelectric resonator filters using a piezoelectric thin film resonators (film bulk acoustic wave resonators), and to a portable telephone incorporating the antenna sharing device.

2. Related Art

The film bulk acoustic wave resonator (FBAR) is an element formed in which a thin film piezoelectric body made of aluminum nitride (AlN), zinc oxide (ZnO), or the like is sandwiched by a pair of electrodes, and the element is formed on an air gap formed on a substrate. The film bulk acoustic wave resonator has approximately the same electric characteristics as a surface acoustic wave (SAW) resonator, and hence, it is possible to form a filter and an antenna sharing device for a high frequency circuit used in a portable telephone or the like by combining the film bulk acoustic wave resonators.

The antenna sharing device is a device which branches and couples signals in order to perform transmission and reception in different frequency bands by means of one antenna, and is referred to as a branching filter and a duplexer. The antenna sharing devices are widely used as a fundamental configuration in which one of input/output terminal pair is connected to a common signal terminal pair, and a phase shifter and a matching circuit are inserted in the common signal terminal pair or between the filter and the common signal terminal pair (see Japanese Patent Laid-Open No. 10-313229, Japanese Patent Laid-Open No. 2001-24476, Japanese Patent No. 3487692).

As the filter in the antenna sharing device, a band pass filter formed by using a 1-terminal pair resonator consisting of a surface acoustic wave resonator or a film bulk acoustic wave resonator as a serial resonator and a parallel resonator, and by connecting the resonators in a ladder shape, or the like, has been used.

The phase shifter and the matching circuit in the antenna sharing device are provided in order that a signal inputted from the common signal terminal pair into one filter or a signal outputted from the one filter to the common signal terminal pair is prevented from being inputted into the other filter. Specifically, the input impedance of the other filter is made very larger than that of the signal in the pass band of the one filter by the phase shifter and the matching circuit, to prevent the signal from being inputted to the other filter.

An inductor referred to as an extension coil or the like is connected to the parallel resonator constituting the filter in the antenna sharing device. As the stopband of the one filter, an attenuation pole is formed in frequencies corresponding to the pass band of the other filter to provide a large attenuation quantity for the one filter, thereby suppressing the leakage of transmission and reception signals. The phase shifter, the matching circuit, and the extension coil, as described above, can be produced in a package of the antenna sharing device, and on a ceramic substrate, a resin substrate or the like on which the filter is mounted.

With the above described constitution of the antenna sharing device, it is possible to produce an antenna sharing device which is capable of passing a signal at a low loss in the pass band of one filter, preventing the signal from being inputted into the other filter, greatly attenuating a signal in the pass band of the other filter, and having an increased isolation quantity between the input terminal pair and the output terminal pair which are provided for the two filters.

As a technique relating to the above described antenna sharing device, a multi-terminal pair SAW filter and a method of using the filter have been proposed in Japanese Patent Laid-open No. 10-313229. In the filter disclosed in the patent document, an antenna sharing device has two ladder type filters with different pass bands formed by using a plurality of surface acoustic wave resonators, and one of the input terminal pair and the output terminal pair of the respective ladder type filters is connected to a common terminal, and further, a matching inductor is connected to the common signal terminal pair.

As another technique, for example, a transmission/reception switching device has been proposed in Japanese Patent Laid-open No. 2001-24476. In this transmission/reception switching device, an antenna sharing device has two ladder type filters with different pass bands formed by using a plurality of film bulk acoustic wave resonators, and one of the input terminal pair and the output terminal pair of the respective ladder type filters is connected to a common signal terminal pair, and further, a phase shifter is inserted between one of the ladder type filters and the common terminal. Here, extension coils are connected to the parallel resonators.

As another technique, for example, a branching filter has been proposed in the patent document 3. In this branching filter, an antenna sharing device has two ladder type filters with different pass bands formed by using a plurality of surface acoustic wave resonators, and one of the input terminal pair and the output terminal pair of the respective ladder type filters are connected to a common signal terminal pair, and further, a matching circuit having inductors and capacitors is inserted between the respective ladder type filters and the common signal terminal pair.

In recent years, in mobile communication devices such as a portable telephone and an automobile telephone, in order to meet the demand for miniaturization of the devices, the antenna sharing device is desired to be further miniaturized. However, in the case where element intervals between the matching inductor, the phase shifter, the matching circuit, which are provided for the common terminals, and the extension coil or the like are reduced in accordance with the miniaturization, there is a possibility that the crosstalk of a signal is generated in the above described prior art, and thereby the attenuation quantity of the attenuation pole formed in the block band and the isolation quantity between the filters are reduced.

SUMMARY OF THE INVENTION

An object of the invention is to provide an antenna sharing device and a portable telephone which are capable of preventing signal passing characteristics between a common signal terminal pair and filters from being deteriorated even by the miniaturization are miniaturized.

According to one embodiment of the present invention, an antenna sharing device, comprising:

a common signal terminal pair which inputs and outputs a signal;

a first terminal pair which transmits the signal with the common signal terminal pair;

a second terminal pair which transmits the signal with the common signal terminal pair;

a first filter which passes the signal with a predetermined frequency bandwidth including a first frequency and uses the common signal terminal pair and the first terminal pair as input and output terminals, and the first filer including a plurality of piezoelectric thin films;

a second filter which passes the signal with a predetermined frequency bandwidth including a second frequency and uses the common signal terminal pair and the second terminal pair as input and output terminals, and the second filer including a plurality of piezoelectric thin films;

a first inductor element connected between the common signal terminal pair;

a plurality of second inductor elements which are connected to the first filter and form a resonator resonated with the second frequency; and a plurality of third inductor elements which are connected to the second filter and form a resonator resonated with the first frequency, wherein the second and third inductor elements have a plurality of inductor elements, respectively; and an inductor element closest to the first terminal pair among the inductor elements included in the second inductor elements and an inductor element closest to the second terminal pair among the third inductor elements are arranged further away from the first inductor element than the other inductor elements included in the second and third inductor elements, or formed on a substrate different from a substrate on which the first inductor element is formed, or formed opposite to the first inductor element by sandwiching a shielding pattern.

Furthermore, according to one embodiment of the present invention, portable phone, comprising:

an antenna which receives a wireless signal;

an antenna sharing device which switches a transmission signal and a reception signal for the antenna;

a receiver which decodes the reception signal which is received by the antenna and passes the antennal sharing device; and a transmitter which generates the transmission signal to be transmitted from the antenna via the antenna sharing device, wherein the antenna sharing device includes:

a common signal terminal pair which inputs and outputs a signal;

a first terminal pair which transmits the signal with the common signal terminal pair;

a second terminal pair which transmits the signal with the common signal terminal pair;

a first filter which passes the signal with a predetermined frequency bandwidth including a first frequency and uses the common signal terminal pair and the first terminal pair as input and output terminals, and the first filter including a plurality of piezoelectric thin films;

a second filter which passes the signal with a predetermined frequency bandwidth including a second frequency and uses the common signal terminal pair and the second terminal pair as input and output terminals, and the second filter including a plurality of piezoelectric thin films;

a first inductor element connected between the common signal terminal pair;

a plurality of second inductor elements which are connected to the first filter and form a portion of a resonator resonated with the second frequency; and a plurality of third inductor elements which are connected to the second filter and form a portion of a resonator resonated with the first frequency, wherein the second and third inductor elements have a plurality of inductor elements, respectively; and an inductor element closest to the first terminal pair among the inductor elements included in the second inductor elements and an inductor element closest to the second terminal pair among the third inductor elements are arranged further away from the first inductor element than the other inductor elements included in the second and third inductor elements, or formed on a substrate different from a substrate on which the first inductor element is formed, or formed opposite to the first inductor element by sandwiching a shielding pattern.

BRIEF DESCRIPTION OF THE DRAWINGS

FIG. 1 is a circuit diagram of an antenna sharing device according to a first embodiment of the present invention;

FIG. 6 is a figure showing a result obtained by comparing signal passing intensity detected by variously selecting an inductor element to be arranged adjacent to the inductor element L from the inductor elements L1 to L5, with signal passing intensity in the case where the inductor element L is sufficiently separated from the inductor elements L1 to L5;

DETAILED DESCRIPTION OF THE INVENTION

Figure 2:
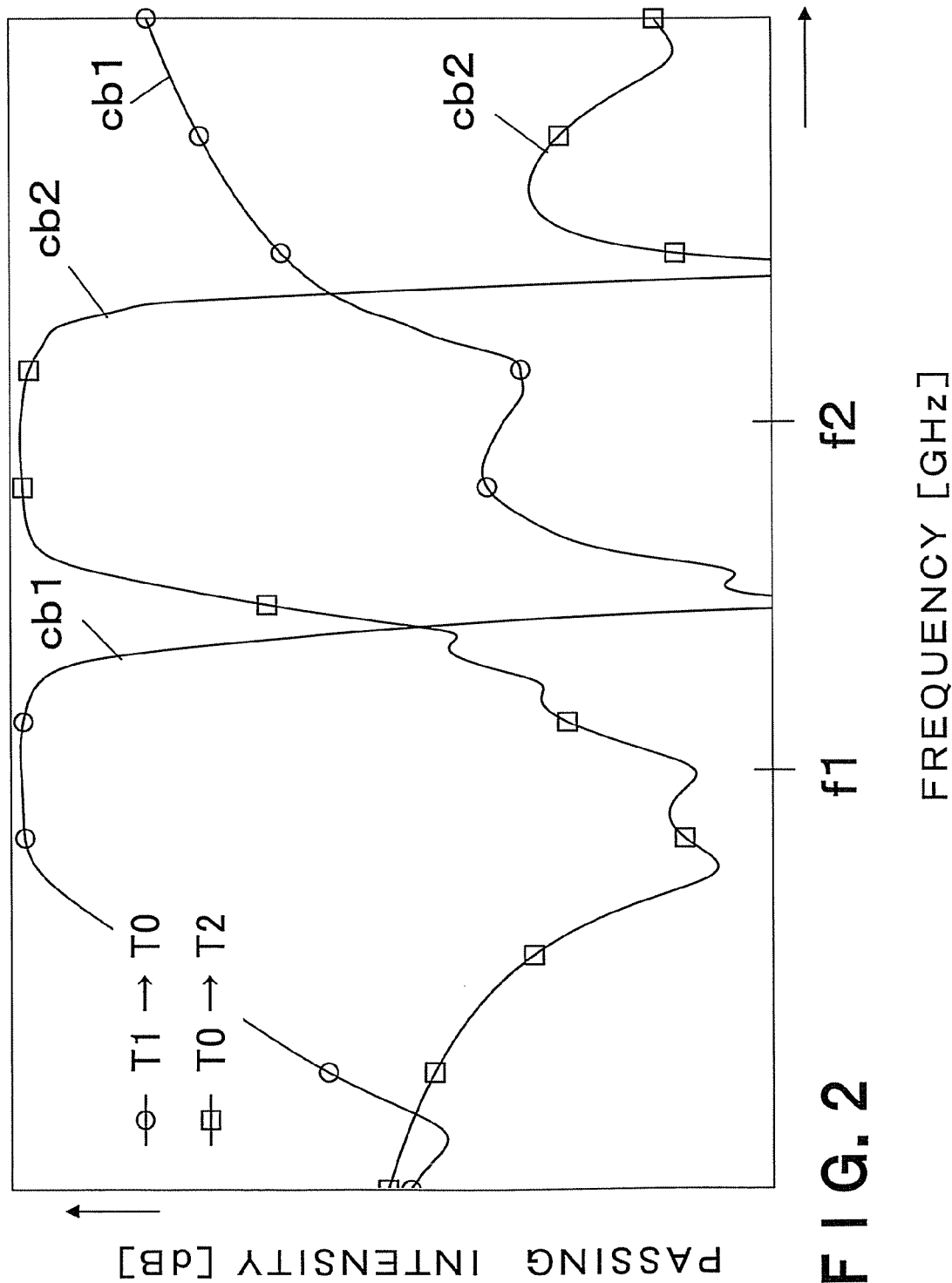
FIG. 2 is a figure showing a signal passing characteristic between a common signal terminal pair T0 and a first terminal pair T1 and a signal passing characteristic between the common signal terminal pair T0 and a second terminal pair T2, in an ideal case where an inductor element L is arranged to be sufficiently separated from inductor elements L1 to L5.

In the following, embodiments according to the present invention will be described with reference to the accompanying drawings.

FIG. 1 is a circuit diagram of an antenna sharing device according to a first embodiment of the present invention. The antenna sharing device shown in FIG. 1 is connected to, for example, an antenna of a portable telephone.

The antenna sharing device shown in FIG. 1 includes a common signal terminal pair T0 for inputting and outputting a signal from and to an antenna (not shown), a first terminal pair T1 for transmitting a signal to the common signal terminal pair T0, a second terminal pair T2 for receiving a signal from the common signal terminal pair T0, a first filter (first film bulk acoustic wave resonator filter) F1 connected between the common signal terminal pair T0 and the first terminal pair T1, a second filter (second film bulk acoustic wave resonator filter) F2 connected between the common signal terminal pair T0 and the second terminal pair T2, an inductor element L connected to the common signal terminal pair T0, inductor elements L1 and L2 connected to the first film bulk acoustic wave resonator filter F1, and inductor elements L3, L4 and L5 connected to the second film bulk acoustic wave resonator filter F2. The first film F1 includes a plurality of piezoelectric thin films and the second film F2 includes a plurality of piezoelectric thin films.

The first film bulk acoustic wave resonator filter F1 extracts a signal of a first frequency band included in the signal inputted into the first terminal pair T1, and outputs the extracted signal to the common signal terminal pair T0. The second film bulk acoustic wave resonator filter F2 extracts a signal of a second frequency band included in the signal inputted into the common signal terminal pair T0, and outputs the extracted signal to the second terminal pair T2.

The first film bulk acoustic wave resonator filter F1 has a serial resonator Rs consisting of two film bulk acoustic wave resonators which are connected in series, and a parallel resonator Rp consisting of two film bulk acoustic wave resonators which are connected in parallel. Inductor elements L1 and L2 are connected in series with each of the film bulk acoustic wave resonators constituting the parallel resonator Rp, respectively.

The second film bulk acoustic wave resonator filter F2 has a serial resonator Rs consisting of three film bulk acoustic wave resonators which are connected in series, and a parallel resonator Rp consisting of three film bulk acoustic wave resonators which are connected in parallel. Inductor elements L3, L4 and L5 are connected in series with each of the film bulk acoustic wave resonators constituting the parallel resonator Rp, respectively.

The inductance of the inductor element L is adjusted in such a manner that the impedance of the second film bulk acoustic wave resonator filter F2 as a single body when seen from the side of the common signal terminal pair T0 is in parallel resonance with the inductor element L connected to the common signal terminal pair T0 in a pass band f1 of the first film bulk acoustic wave resonator filter F1, and the impedance of the first film bulk acoustic wave resonator filter F1 as a single body when seen from the side of the common signal terminal pair T0 is in parallel resonance with the inductor element L connected to the common signal terminal pairs T0 in a pass band f2 of the second film bulk acoustic wave resonator filter F2.

Such adjustment makes it possible to prevent a signal in the pass band f1 of the first film bulk acoustic wave resonator filter F1 from being inputted into the second film bulk acoustic wave resonator filter F2. Similarly, a signal in the pass band of the second film bulk acoustic wave resonator filter F2 is prevented from being inputted into the first film bulk acoustic wave resonator filter F1. Thus, the common signal terminal pair T0 can be shared by the first and second film bulk acoustic wave resonator filters F1 and F2.

The inductance of inductor elements L1 to L5 is adjusted in such a manner that the impedance of the parallel resonator Rp in the first film bulk acoustic wave resonator filter F1 is resonated in series with inductor elements L1 and L2 connected to the parallel resonator Rp in the pass band of the second film bulk acoustic wave resonator filter F2, and the impedance of the parallel resonator Rp in the second film bulk acoustic wave resonator filter F2 is resonated in series with inductor elements L3 to L5 connected to the parallel resonator Rp in the pass band f1 of the first film bulk acoustic wave resonator filter F1.

By adjusting the inductance of the inductor elements L1 to L5, as described above, the signal passing intensity of the first film bulk acoustic wave resonator filter F1 significantly attenuates in the pass band f2 of the second film bulk acoustic wave resonator filter F2, and the signal passing intensity of the second film bulk acoustic wave resonator filter F2 significantly attenuates in the pass band f1 of the first film bulk acoustic wave resonator filter F1. As a result, the isolation quantity between the first terminal pair T1 and the second terminal pair T2 increases, and the leakage of signal is suppressed.

When the inductor element L connected to the common signal terminal pair T0 is arranged adjacent to the other inductor elements L1 to L5, the inductor elements are made to be capacitively and inductively coupled with each other, and thereby the signal passing characteristic of a signal are more or less changed.

Figure 3:
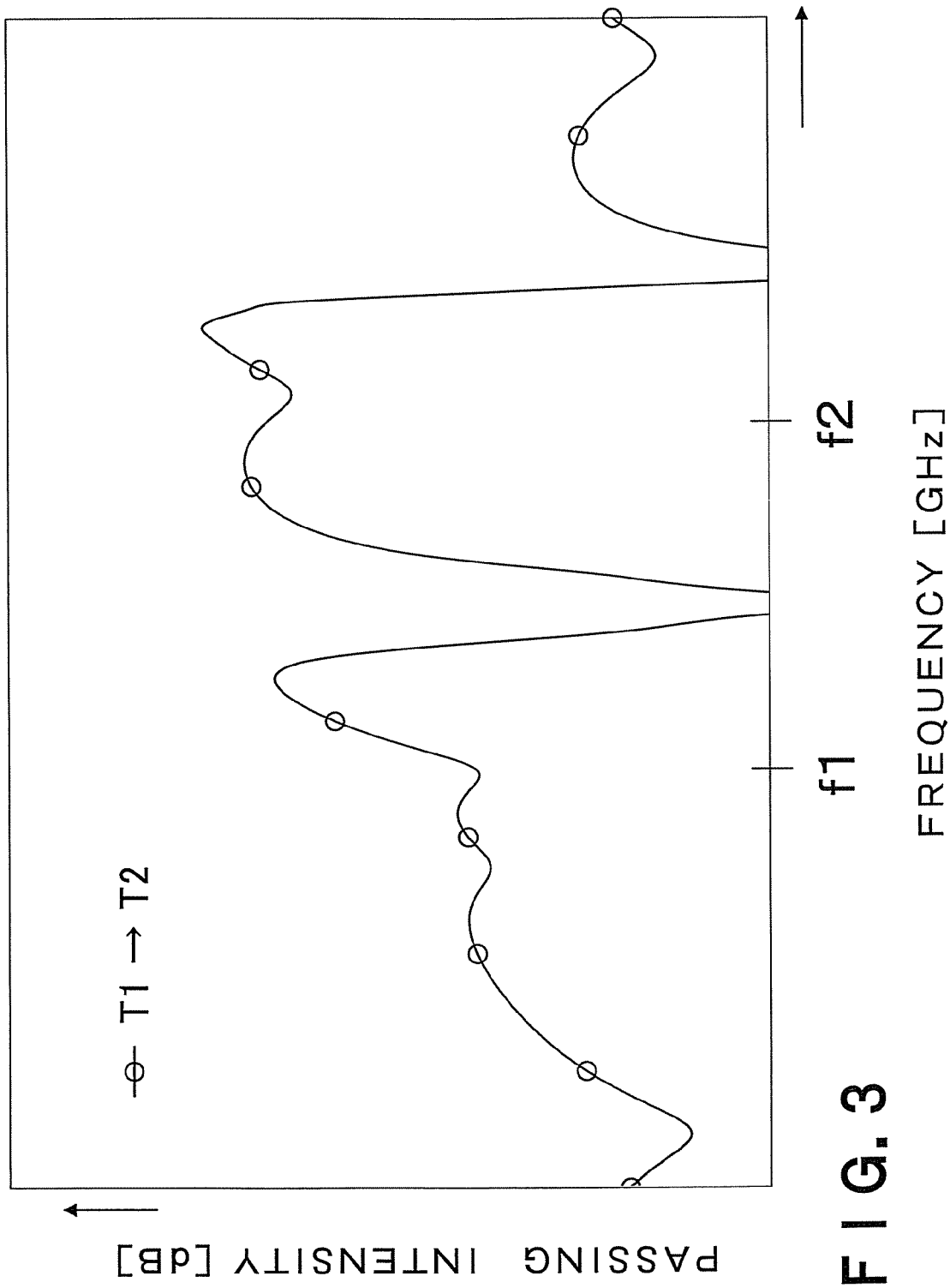
FIG. 3 is a figure showing a signal passing characteristic between the first terminal pair T1 and the second terminal pair T2 under the same condition as in FIG. 2.

FIG. 2 is a figure showing a signal passing characteristic between the common signal terminal pair T0 and the first terminal pair T1 and a signal passing characteristic between the common signal terminal pair T0 and the second terminal pair T2, in an ideal case where the inductor element L is arranged to be sufficiently separated from the inductor elements L1 to L5. FIG. 3 is a figure showing a signal passing characteristic (isolation quantity) between the first terminal pair T1 and the second terminal pair T2 under the same condition as in FIG. 2.

A curve cb1 connecting plots "○" in FIG. 2 represents a signal passing characteristic in case where an input signal from the first terminal pair T1 is passed through the first film bulk acoustic wave resonator filter F1 and outputted to the common signal terminal pair T0, and a curve cb2 connecting plots "□" represents a signal passing characteristic in case where an input signal from the common signal terminal pair T0 is passed through the second film bulk acoustic wave resonator filter F2 and outputted to the second terminal pair T2.

The difference between the center frequency f1 of the curve cb1 and the center frequency f2 of the curve cb2 is several tens to several hundreds MHz.

As can be seen from FIG. 2, the curve cb1 and the curve cb2 are different from each other in the signal pass bands. As can be seen from FIG. 3, the first terminal pair T1 and the second terminal pair T2 are different in the signal pass bands, and hence, the signal leakage from the first terminal pair T1 to the second terminal pair T2 is little.

Figure 4:
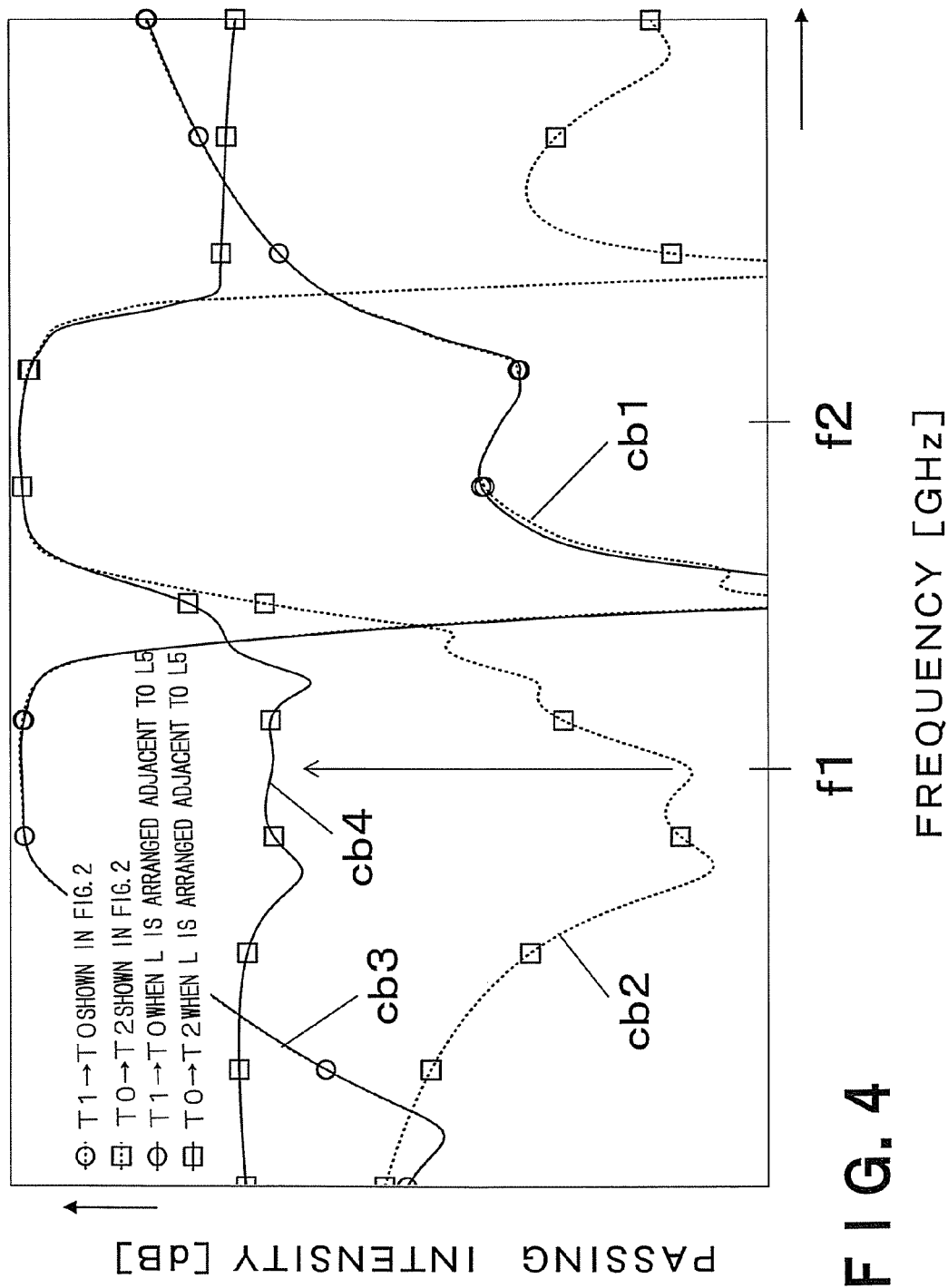
FIG. 4 is a figure showing signal passing characteristics in the case where the inductor element L is arranged adjacent to the inductor element L5 closest to the second terminal pair T2, and is sufficiently separated from the other inductor elements L1 to L4.
Figure 5:
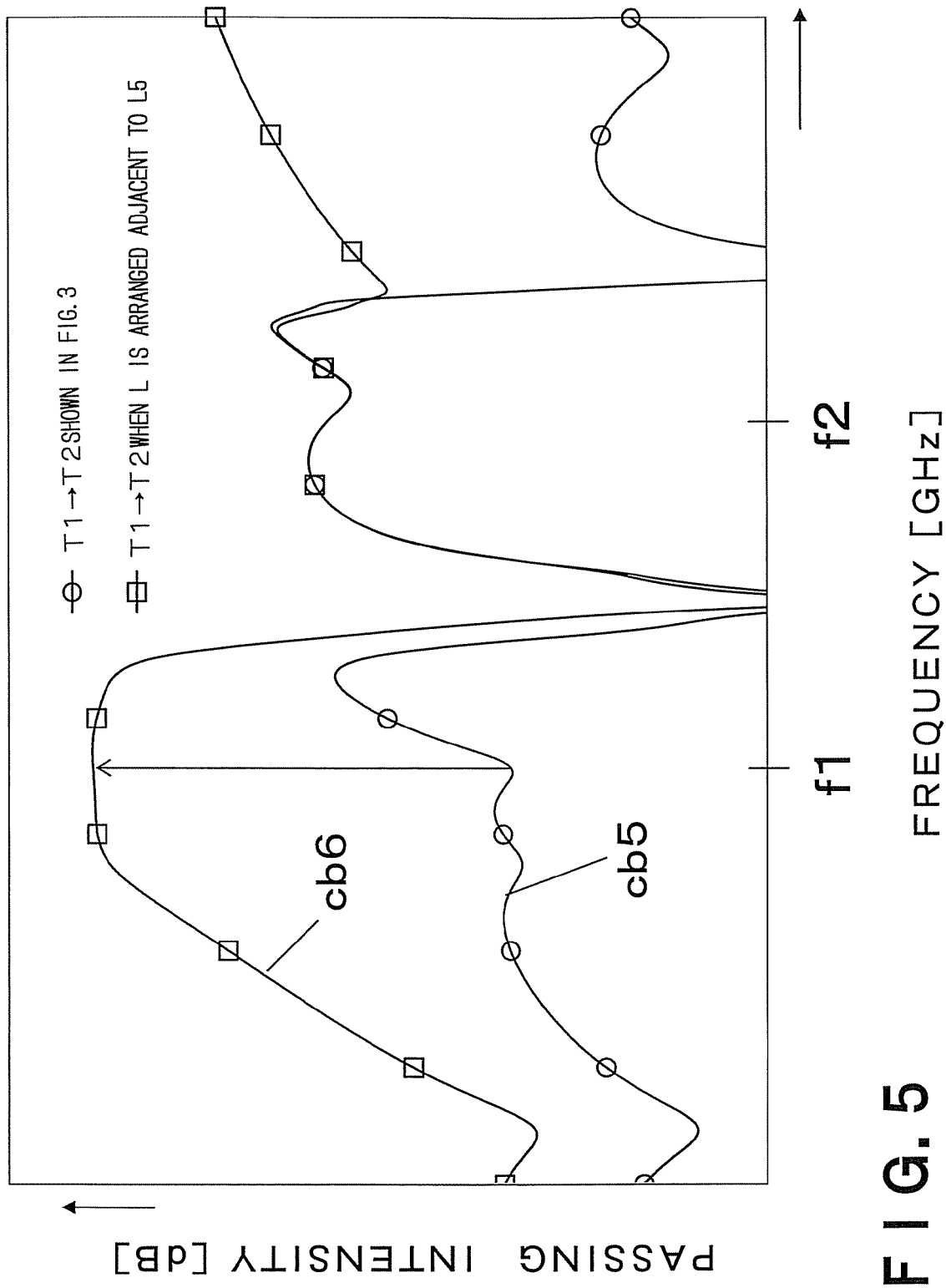
FIG. 5 is a figure showing a signal passing characteristic between the first terminal pair T1 and the second terminal pair T2 under the same condition as in FIG. 4.

On the other hand, FIG. 4 is a figure showing signal passing characteristics in the case where the inductor element L is arranged adjacent to the inductor element L5 closest to the second terminal pair T2, and is sufficiently separated from the other inductor elements L1 to L4. FIG. 5 is a figure showing a signal passing characteristic between the first terminal pair T1 and the second terminal pair T2 under the same condition as in FIG. 4.

A curve cb3 connecting plots "○" in FIG. 4 represents a signal passing characteristic from the first terminal pair T1 to the common signal terminal pair T0 in the case where the inductor element L is arranged adjacent to the inductor element L5, and a curve cb4 connecting plots "□" in FIG. 4 represents a signal passing characteristic from the common signal terminal pair T0 to the second terminal pair T2 in the case where the inductor element L is arranged adjacent to the inductor element L5. In FIG. 4, the two curves cb1 and cb2 shown in FIG. 2 are shown by broken lines.

As can be seen from FIG. 4, when the inductor element L is arranged adjacent to the inductor element L5, in the pass band f1 of the first film bulk acoustic wave resonator filter F1, the signal passing intensity between the common signal terminal pair T0 and the second terminal pair T2 is significantly increased as compared with the signal passing intensity in the case where the inductor element L is sufficiently separated from the inductor element L5.

Similarly, as can be seen from FIG. 5, the signal passing intensity from the first terminal pair T1 to the second terminal pair T2 is significantly increased in the pass band f1 of the first film bulk acoustic wave resonator filter F1.

In addition to FIG. 4 and FIG. 5, the present inventors compared the signal passing intensity detected by variously selecting an inductor element to be arranged adjacent to the inductor element L from the inductor elements L1 to L5, with the signal passing intensity in the case where the inductor element L is sufficiently separated from the inductor elements L1 to L5. FIG. 6 is a figure showing the comparison results.

In FIG. 6, ILT represents a change quantity of the signal passing intensity between the common signal terminal pair T0 and the first terminal pair T1 in the pass band f2 of the second film bulk acoustic wave resonator filter F2. IST represents a change quantity of the signal passing intensity between the first terminal pair T1 and the second terminal pair T2 in the pass band f2 of the second film bulk acoustic wave resonator filter F2. ILR represents a change quantity of the signal passing intensity between the common signal terminal pair T0 and the second terminal pair T2 in the pass band f1 of the first film bulk acoustic wave resonator filter F1. ISR represents a change quantity of the signal passing intensity between the first terminal pair T1 and the second terminal pair T2 in the pass band f1 of the first film bulk acoustic wave resonator filter F1. In FIG. 6, a positive numerical value indicates that the signal passing intensity is increased.

As can be seen from FIG. 6, in the case where the inductor element L adjacent to the common signal terminal pair T0 is arranged adjacent to the inductor element L2 closest to the first terminal pair T1, or in the case where the inductor element L is arranged adjacent to the inductor element L5 closest to the second terminal pair T2, the signal passing intensity in the undesired pass band is larger than those in the case where the inductor element L is arranged adjacent to the other inductor elements L1, L3 and L4. This is considered to be due to the fact that in the case where the inductor element L is arranged adjacent to the inductor element L2 or the inductor element L5, the capacitive coupling and the inductive coupling are generated so as to cause the signal leakage between the common signal terminal pair T0 and the first terminal pair T1 or between the common signal terminal pair T0 and the second terminal pair T2.

The signal leakage is also generated in the case where the inductor element L is arranged adjacent to the inductor element L1, or in the case where the inductor element is arranged adjacent to the inductor element L4, but the degree of the signal leakage in these cases is small because the plurality of serial resonators Rs and parallel resonators RP are connected between the inductor element L1 and the first terminal pair T1 or between the inductor element L4 and the second terminal pair T2.

Therefore, in the case where the inductor element L is arranged adjacent to the inductor element L1, L3 or L4, the signal leakage is hardly generated as compared with the case where the inductor element L is arranged adjacent to the inductor element L2 or L5.

In summary, in the case where the distance between the common signal terminal pair T0 and the first terminal pair T1 is reduced, or in the case where the distance between the common signal terminal pair T0 and the second terminal pair T2 is reduced, the distance between the inductor element L and the inductor element L2 or the distance between the inductor element L and the inductor element L5 is also reduced, as a result of which the degree of signal leakage is increased.

When the antenna sharing device is miniaturized, the inductor element L and the inductor elements L1 to L5 are also arranged adjacent to each other in accordance with the miniaturization. This easily causes an increase in the signal passing intensity (decrease in the attenuation quantity) between the common signal terminal pair T0 and the first terminal pair T1 in the pass band f2 of the second film bulk acoustic wave resonator filter F2, an increase in the signal passing intensity (decrease in the attenuation quantity) between the common signal terminal pair T0 and the second terminal pair T2 in the pass band f1 of the first film bulk acoustic wave resonator filter F1, and an increase in the signal passing intensity (decrease in the isolation quantity) between the first terminal pair T1 and the second terminal pair T2.

In order to suppress such undesirable increase in the signal passing intensity, it is most preferred, as described above, to prevent the inductor element L closest to the common signal terminal pair T0 from being arranged adjacent to the inductor element L2 closest to the first terminal pair T1 or to the inductor element L5 closest to the second terminal pair T2.

More preferably, in addition to the above described conditions, the inductor element L closest to the common signal terminal pair T0 is kept away from the inductor element L1 secondly closest to the first terminal pair T1 next to the inductor element L2, or from the inductor element L4 secondly closest to the second terminal pair T2 next to the inductor element L5, whereby it is possible to further suppress the increase in the signal passing intensity.

Figure 7:
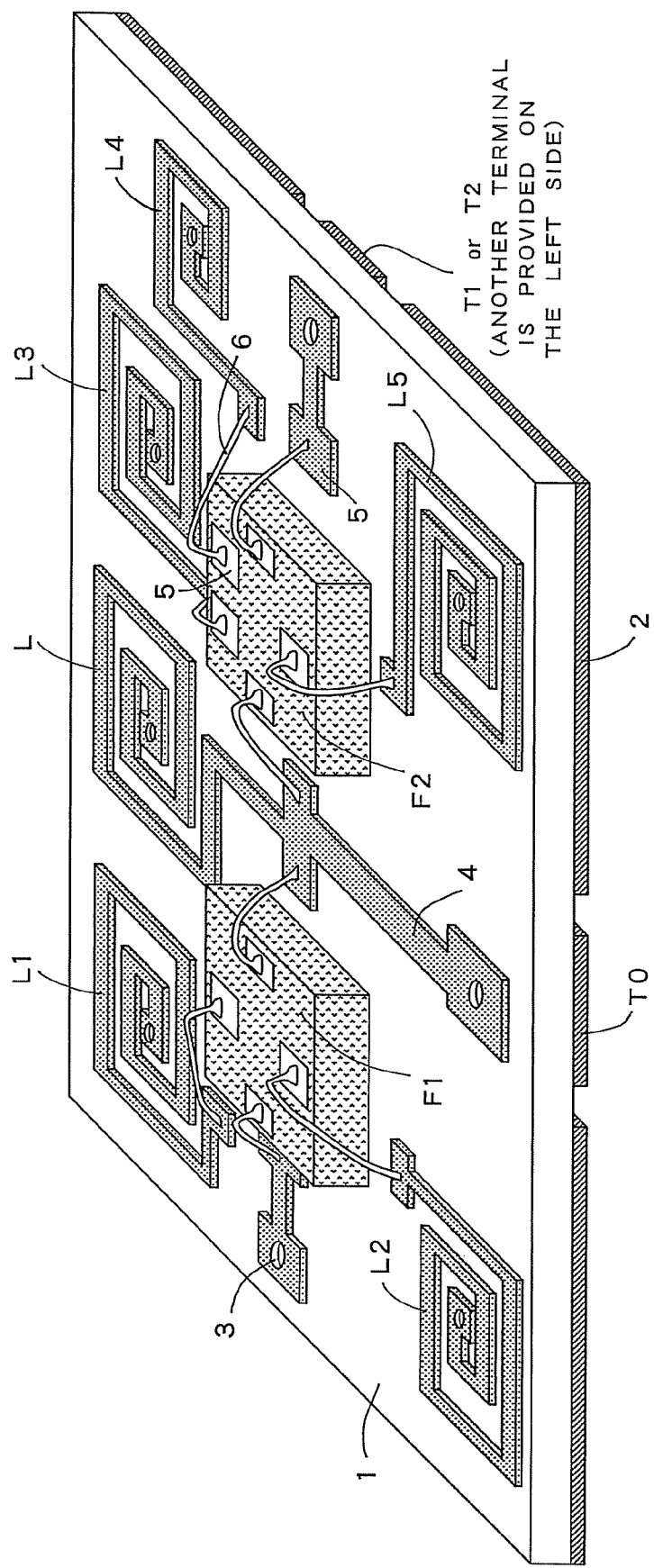
FIG. 7 is a substrate layout drawing showing an example of a mounted form of an antenna sharing device in which the distances between the inductor element L and the inductor elements L2 and L5 are increased as much as possible.

FIG. 7 is a substrate layout drawing showing an example of a mounted form of an antenna sharing device in which the distances between the inductor element L and the inductor elements L2 and L5 are increased as much as possible. In FIG. 7, a common signal terminal pattern for the common signal terminal pair T0, a first terminal pattern for the first terminal pair T1, a second terminal pattern for the second terminal pair T2, and a ground pattern 2 to which one end of the respective terminal pairs is connected are formed on the lower surface side of a substrate 1.

These terminal patterns are electrically conductive to the pattern on the upper surface side of the substrate 1 by through holes 3, respectively. A spiral pattern for the inductor element L is formed at the center backward side on the upper surface of the substrate 1. In the central part of the substrate, the first film bulk acoustic wave resonator filter F1 and the second film bulk acoustic wave resonator filter F2 are arranged opposite to each other so as to sandwich the common signal terminal pattern 4.

The pattern of the inductor element L2 closest to the first terminal pair T1 and the pattern of the inductor element L are arranged opposite to each other in the diagonal direction of the first film bulk acoustic wave resonator filter F1 so as to sandwich the first film bulk acoustic wave resonator filter F1. Similarly, the pattern of the inductor element L5 closest to the second terminal pair T2 and the pattern of the inductor element L are arranged opposite to each other in the diagonal direction of the second film bulk acoustic wave resonator filter F2 so as to sandwich the second film bulk acoustic wave resonator filter F2.

On both sides of the pattern of the inductor element L, patterns of the inductor elements L1 and L3 are arranged, and the pattern of the inductor element L4 is formed on the side of the inductor element L3. Pads 5 of the first and second film bulk acoustic wave resonator filters F1 and F2 and the patterns or the like are connected by wires 6, but may also be connected by the other techniques (such as for example solder bumps).

As described above, in FIG. 7, the inductor element L and the inductor elements L2 and L5 are arranged opposite to each other in the diagonal direction of the first and second film bulk acoustic wave resonator filters F1 and F2 so as to sandwich the first and second film bulk acoustic wave resonator filters F1 and F2, respectively, as a result of which it is possible to increase the distances between the inductor element L and the inductor elements L2 and L5 to thereby reduce the degree of signal leakage.

Figure 8:
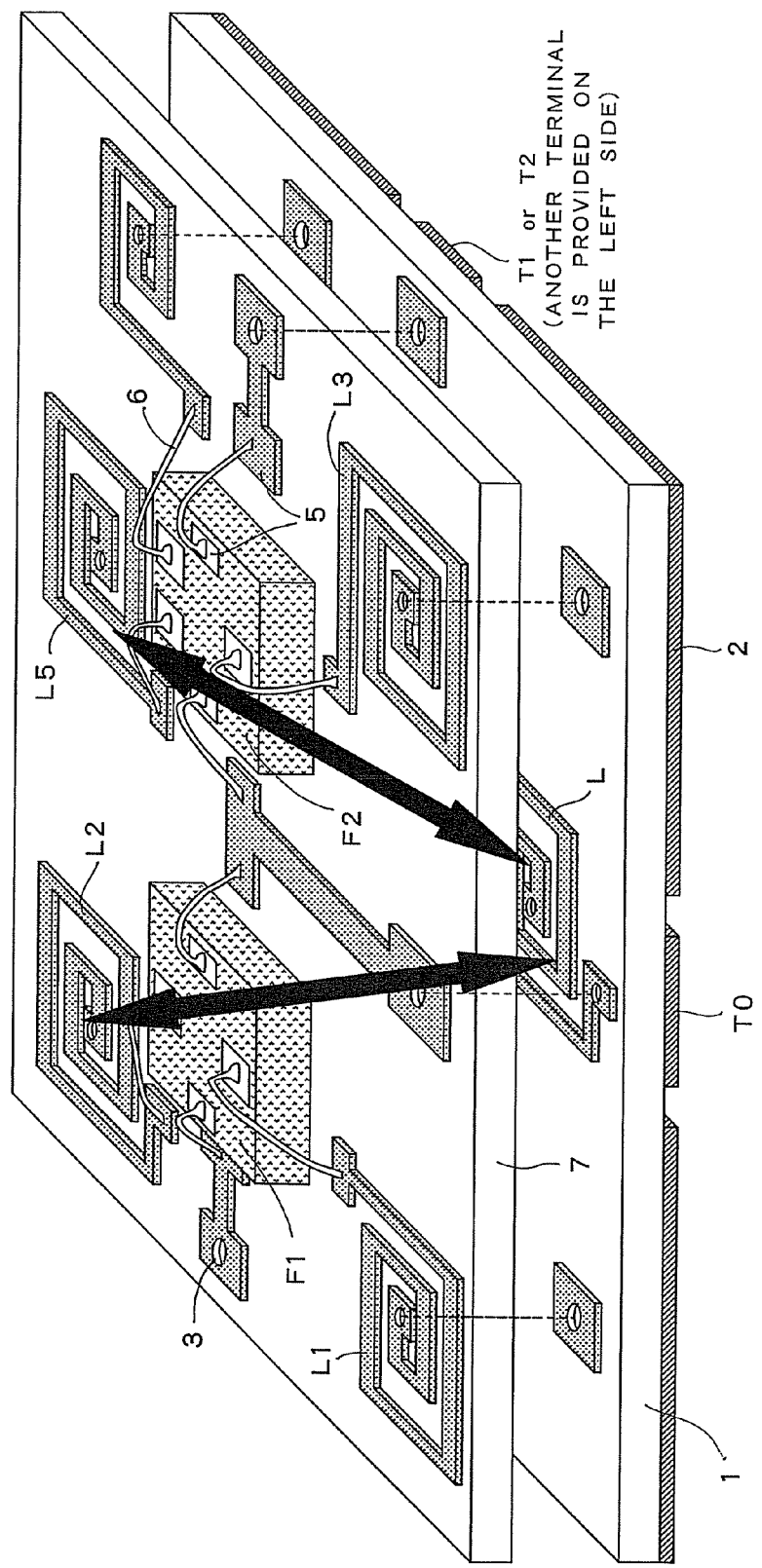
FIG. 8 is a substrate layout drawing of an antenna sharing device showing a first modification of FIG. 7.

FIG. 8 is a substrate layout drawing of an antenna sharing device showing a first modification of FIG. 7. The antenna sharing device shown in FIG. 8 has a configuration in which the common signal terminal, the inductor element L, the first terminal pair T1, and the second terminal pair T2 are formed on a substrate 1, and the other circuit parts (such as the inductor elements L2 and L5) are formed on a substrate 7, and these substrates 1 and 7 are arranged in upper and lower positions. The substrate 1 and the substrate 7 are insulated by air from each other.

In FIG. 8, the positions at which the inductor elements L1 and L2 are formed on the substrate 1 are made reverse to those shown in FIG. 1, and the positions at which the inductor elements L3 and L5 are formed are also similarly made reverse to those shown in FIG. 1. Note that the positions at which the inductor elements are formed are not necessarily made reverse to those shown in FIG. 1.

The inductor elements L2 and L5 on the substrate 7 are arranged so as not to vertically overlap with the inductor element L on the substrate 1. The reason for this is to increase the linear distances between the inductor element L and the inductor elements L2 and L5.

In the case of FIG. 8, since the inductor element L, and inductor elements L2 and L5 are formed on the substrates separated from each other, even when the linear distances between the inductor element L and the inductor elements L2 and L5 are not so large, it is possible to reduce the degree of signal leakage.

Figure 9:
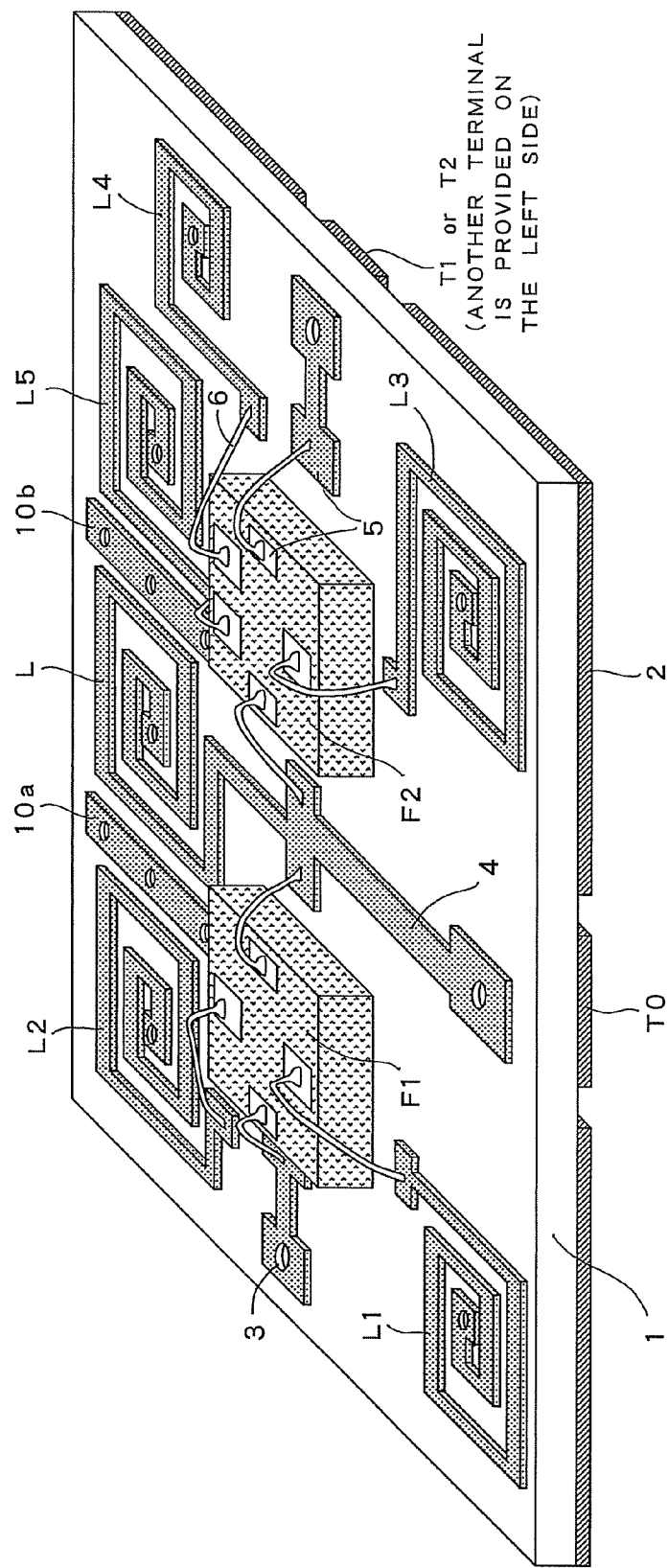
FIG. 9 is a substrate layout drawing of an antenna sharing device showing a second modification of FIG. 7.

On the other hand, FIG. 9 is a substrate layout drawing of an antenna sharing device showing a second modification of FIG. 7. Although the antenna sharing device shown in FIG. 9 is formed by only one substrate 1 as in FIG. 7, the positions at which the inductor elements L1 and L2 are formed on the substrate 1 are made reverse to those in FIG. 1, and similarly, the positions at which the inductor elements L3 and L5 are formed are also made reverse to those in FIG. 1.

On the substrate 1 in FIG. 9, a ground pattern 10a for shielding is formed between the inductor element L and the inductor element L2, and a ground pattern 10b for shielding is also formed between the inductor element L and the inductor element L5.

In the case of FIG. 9, the inductor element L is arranged adjacent to the inductor elements L2 and L5, but it is possible to prevent the signal leakage by arranging the ground patterns 10a and 10b for shielding between the inductor element L and the inductor elements L2 and L5, respectively. Therefore, the arrangement areas of the inductor element L and the inductor elements L2 and L5 are less restricted so that the substrate layout is facilitated.

Figure 10:
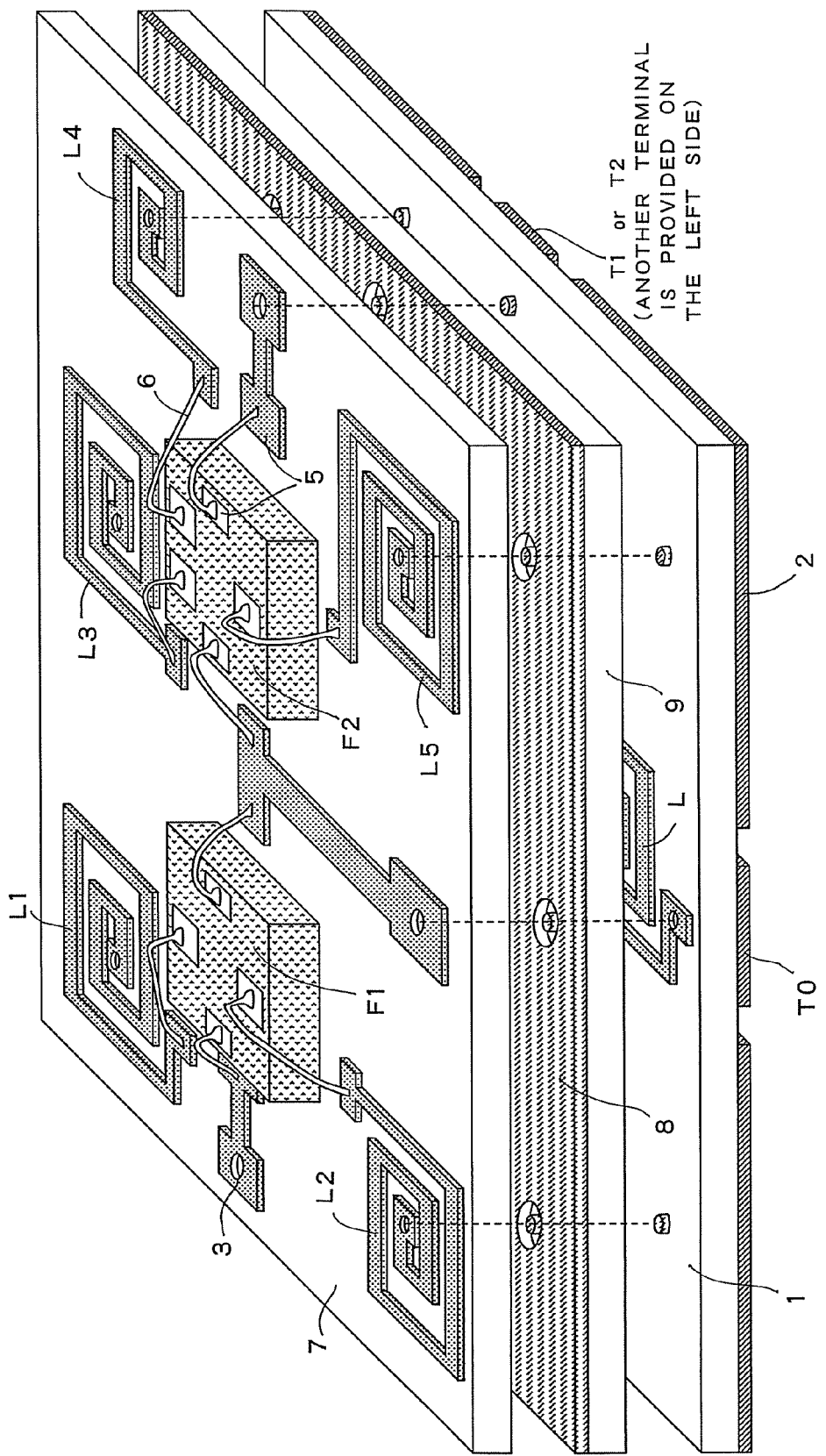
FIG. 10 is a substrate layout drawing of an antenna sharing device showing a third modification of FIG. 7.

FIG. 10 is a substrate layout drawing of an antenna sharing device showing a third modification of FIG. 7. The antenna sharing device shown in FIG. 10 includes a substrate 1 on which the common signal terminal and the inductor element L, the first terminal pair T1, and the second terminal pair T2 are formed, a substrate 7 on which the other circuit parts (such as the inductor elements L2 and L5) are formed, and a shielding substrate 9 which has a (ground) pattern 8 for shielding formed thereon and is arranged between the substrate 1 and the substrate 7.

In the case of FIG. 10, the substrate 1 on which the inductor element L is formed, and the substrate 7 on which the inductor elements L2 and L5 are formed are arranged opposite to each other so as to sandwich the substrate 8 for shielding. This makes it possible to further suppress the capacitive coupling and the inductive coupling between the inductor element L and the inductor elements L2 and L5, thereby reducing the degree of signal leakage.

Figure 11:
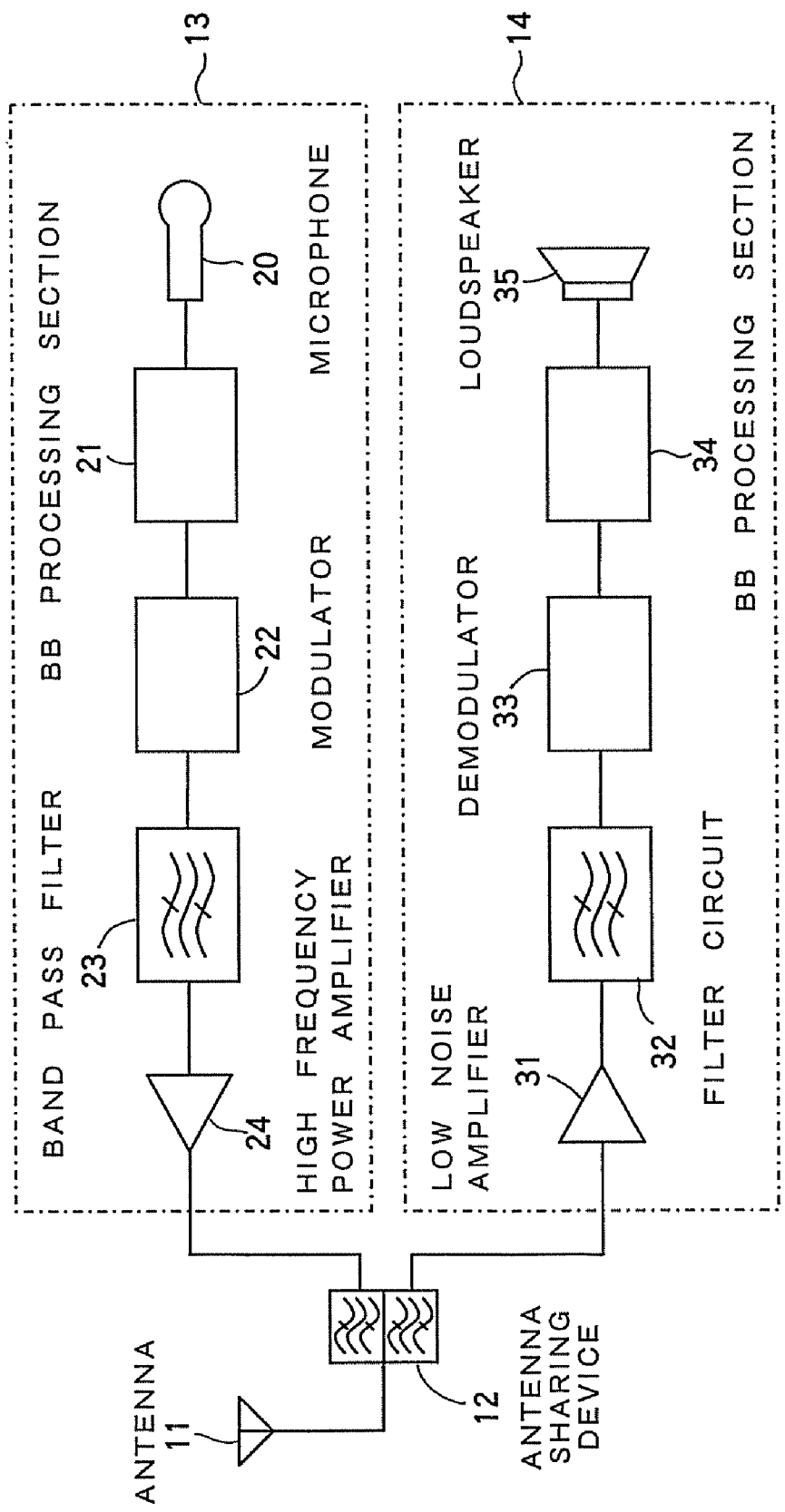
FIG. 11 is a block diagram showing an example of an internal constitution of a portable telephone incorporating the antenna sharing device according to the present embodiment.

The above described antenna sharing devices can be used, for example, for a portable telephone. FIG. 11 is a block diagram showing an example of an internal constitution of a portable telephone incorporating the antenna sharing device according to the present embodiment. The portable telephone shown in FIG. 11 includes the above described antenna sharing device 12 which is connected to an antenna 11, and a transmitting section 13 and a receiving section 14 which are connected to the antenna sharing device 12.

The transmitting section 13 has a BB processing section 21 which generates a baseband signal corresponding to a voice signal received by a microphone 20, a modulator 22 which modulates the baseband signal, a band pass filter 23 which removes unnecessary frequency components contained in the modulated signal, and a high frequency power amplifier 24 which amplifies the signal passed through the band pass filter 23. An output signal of the high frequency power amplifier 24 is transmitted to the antenna 11 via the antenna sharing device 12.

The receiving section 14 has a low noise amplifier 31 which amplifies the reception signal which is received by the antenna 11 and passes through the antenna sharing device 12, a filter circuit 32 which extracts only desired frequency components included in the output signal of the low noise amplifier 31, a demodulator 33 which performs demodulation processing on the basis of the output signal of the filter circuit 32, a BB processing section 34 which performs baseband processing on the basis of the output signal of the demodulator 33, and a loudspeaker 35.

Note that the internal constitution of the portable telephone is not limited to that shown in FIG. 11. Further, the antenna sharing device 12 according to the present embodiment is not only used for the portable telephone, but can be widely applied to various kinds of communication devices (such as for example wireless LAN devices).

As described above, in the antenna sharing device 12 according to the present embodiment, the distance between the inductor element L connected to the common signal terminal and the inductor element L2 closest to the first terminal pair T1 of the first piezoelectric resonator filter is increased as much as possible, and the distance between the inductor element L and the inductor element L5 closest to the second terminal pair T2 of the second piezoelectric resonator filter is increased as much as possible. Thereby, the capacitive coupling and the inductive coupling between the inductor element L and the inductor elements L2 and L5 can be reduced, so that the attenuation quantity of the attenuation poles formed in the block bands of the first and second piezoelectric resonator filters F1 and F2 can be increased, and the increase in the signal passing intensity between the first and second piezoelectric resonator filters F1 and F2 can also be suppressed. As a result, even when the antenna sharing device 12 as a whole is miniaturized, it is possible to obtain a highly efficient antenna sharing device 12 with little signal leakage.

In the above described embodiment, the internal constitution of the first and second film bulk acoustic wave resonator filters F1 and F2 is not limited to that shown in FIG. 1. The connection form in the serial resonator Rs and the parallel resonator Rp, the number of the film bulk acoustic wave resonators in the serial resonator Rs, and the number of the film bulk acoustic wave resonators in the parallel resonator Rp can be arbitrarily changed.

In FIG. 1 described above, an example has been explained in which the first film bulk acoustic wave resonator filter F1 is used on the transmitting side where a signal is transmitted from the first terminal pair T1 to the common signal terminal pair T0, and the second film bulk acoustic wave resonator filter F2 is used on the receiving side where a signal is transmitted from the common signal terminal pair T0 to the second terminal pair T2, but the flow of the signals passing the filters may also be reversed. That is, the first film bulk acoustic wave resonator filter F1 may be used on the receiving side where a signal is transmitted from the common signal terminal pair T0 to the first terminal pair T1, and the second film bulk acoustic wave resonator filter F2 may also be used on the transmitting side where a signal is transmitted from the second terminal pair T2 to the common signal terminal pair T0.

Alternatively, both the first and second film bulk acoustic wave resonator filters F1 and F2 may bidirectionally transmit and receive a signal. Alternatively, both filters may be used on the transmitting side where a signal is transmitted from the first and second terminal pairs T1 and T2 to the common signal terminal pair T0, or may also be used on the receiving side where a signal is transmitted from the common signal terminal to the first and second terminal pairs T1 and T2.

In FIG. 1 described above, an example is explained in which the inductor elements L1 to L5 are connected in series with the parallel resonators RP, but the inductor elements L1 to L5 may be connected in parallel with the parallel resonators Rp. Alternatively, the inductor elements L1 to L5 may also be connected in series or parallel with the serial resonators Rs. Even in these cases, it is preferred that the inductor element L is kept away as much as possible from the inductor elements L2 and L5 which are closest to the first terminal T1 and the second terminal T2, respectively.

What is claimed is:

1. An antenna sharing device, comprising:
a common signal terminal pair which inputs and outputs a signal;
a first terminal pair which transmits the signal with the common signal terminal pair;
a second terminal pair which transmits the signal with the common signal terminal pair;
a first filter which passes the signal with a predetermined frequency bandwidth including a first frequency and uses the common signal terminal pair and the first terminal pair as input and output terminals;
a second filter which passes the signal with a predetermined frequency bandwidth including a second frequency and uses the common signal terminal pair and the second terminal pair as input and output terminals;
a first inductor element connected between the common signal terminal pair;

second inductor elements which are connected to the first filter and form a structure that resonated with the second frequency; and
third inductor elements which are connected to the second filter and form a structure that resonated with the first frequency,
wherein the second and third inductor elements have a plurality of inductor elements, respectively;
an inductor element closest to the first terminal pair among the second inductor elements and an inductor element closest to the second terminal pair among the third inductor elements are arranged further away from the first inductor element than the other inductor elements included in the second and third inductor elements;
the first to third inductor elements and the first and second filters are formed on the same substrate;
the first inductor element and the inductor element formed closest to the first terminal pair among the second inductor elements are arranged opposite to each other by sandwiching the first filter; and
the first inductor element and the inductor element formed closest to the second terminal pair among the third inductor elements are arranged opposite to each other by sandwiching the second filter.

2. The device according to claim 1,
wherein the first filter has:
a first serial resonator formed by using a first plurality of series piezoelectric thin film resonators; and
a first parallel resonator formed by using a first plurality of parallel piezoelectric thin film resonators,
the second filter has:
a second serial resonator formed by using a second plurality of series piezoelectric thin film resonators; and
a second parallel resonator formed by using a second plurality of parallel piezoelectric thin film resonators,
the second inductor elements are connected to the first serial resonator or the first parallel resonator, and
the third inductor elements are connected to the second serial resonator or the second parallel resonator.

3. The device according to claim 2,
wherein the second inductor elements are connected in series to the first parallel resonator, and resonate in series with an impedance of the first parallel resonator by the second frequency; and
the third inductor elements are connected in series to the second parallel resonator, and resonate in series with an impedance of the second parallel resonator by the first frequency.

4. The device according to claim 2,
wherein the second inductor elements are connected in series to the first serial resonator, or connected in parallel to the first serial resonator, or connected in series to the first parallel resonator, or connected in parallel to the first parallel resonator, and
the third inductor elements are connected in series to the second serial resonator, connected in parallel to the second serial resonator, or connected in series to the second parallel resonator, or connected in parallel to the second parallel resonator.

5. The device according to claim 1,
wherein the first filter is configured to extract a signal with the frequency bandwidth including the first frequency included in a signal inputted to the common signal terminal pair to output the extracted signal from the first terminal pair or configured to extract a signal with frequency bandwidth including the first frequency included in a signal inputted to the first terminal pair to output the extracted signal from the common signal terminal pair; and the second filter is configured to extract a signal with the frequency bandwidth including the second frequency included in a signal inputted to the common signal terminal pair to output the extracted signal from the second terminal pair or configured to extract a signal with frequency bandwidth including the second frequency included in a signal inputted to the second terminal pair to output the extracted signal from the common signal terminal pair.

6. An antenna sharing device, comprising:
a common signal terminal pair which inputs and outputs a signal;
a first terminal pair which transmits the signal with the common signal terminal pair;
a second terminal pair which transmits the signal with the common signal terminal pair;
a first filter which passes the signal with a predetermined frequency bandwidth including a first frequency and uses the common signal terminal pair and the first terminal pair as input and output terminals, and the first filter including a plurality of piezoelectric thin films;
a second filter which passes the signal with a predetermined frequency bandwidth including a second frequency and uses the common signal terminal pair and the second terminal pair as input and output terminals, and the second filter including a plurality of piezoelectric thin films;
a first inductor element connected between the common signal terminal pair;
second inductor elements which are connected to the first filter and form a structure that resonated with the second frequency; and
third inductor elements which are connected to the second filter and form a structure that resonated with the first frequency,
a first substrate having the second inductor elements, the third inductor elements, the first filter and the second filter; and
a second substrate having the first inductor element,
wherein the second and third inductor elements have a plurality of inductor elements, respectively.

7. An antenna sharing device, comprising:
a common signal terminal pair which inputs and outputs a signal;
a first terminal pair which transmits the signal with the common signal terminal pair;
a second terminal pair which transmits the signal with the common signal terminal pair;
a first filter which passes the signal with a predetermined frequency bandwidth including a first frequency and uses the common signal terminal pair and the first terminal pair as input and output terminals, and the first filter including a plurality of piezoelectric thin films;
a second filter which passes the signal with a predetermined frequency bandwidth including a second frequency and uses the common signal terminal pair and the second terminal pair as input and output terminals, and the second filter including a plurality of piezoelectric thin films;
a first inductor element connected between the common signal terminal pair;
second inductor elements which are connected to the first filter and form a structure that resonated with the second frequency; and third inductor elements which are connected to the second filter and form a structure that resonated with the first frequency,
wherein the second and third inductor elements have a plurality of inductor elements, respectively;
the first to third inductor elements and the first and second filters are formed on the same substrate;
the first inductor element and an inductor element closest to the first terminal among the second inductor elements are arranged opposite to each other by sandwiching the shielding pattern; and
the first inductor element and an inductor element closest to the second terminal among the third inductor elements are arranged opposite to each other by sandwiching the shielding pattern.

8. A portable phone, comprising:
an antenna which receives a wireless signal;
an antenna sharing device which passes a transmission signal and a reception signal for the antenna;
a receiver which decodes a reception signal which is received by the antenna and the reception signal passes the antenna sharing device; and
a transmitter which generates the transmission signal to be transmitted from the antenna via the antenna sharing device,
wherein the antenna sharing device includes:
a common signal terminal pair which inputs and outputs a signal;
a first terminal pair which transmits the signal with the common signal terminal pair;
a second terminal pair which transmits the signal with the common signal terminal pair;
a first filter which passes the signal with a predetermined frequency bandwidth including a first frequency and uses the common signal terminal pair and the first terminal pair as input and output terminals;
a second filter which passes the signal with a predetermined frequency bandwidth including a second frequency and uses the common signal terminal pair and the second terminal pair as input and output terminals;
a first inductor element connected between the common signal terminal pair;
second inductor elements which are connected to the first filter and form a portion of a structure that resonated with the second frequency; and
third inductor elements which are connected to the second filter and form a portion of a structure that resonated with the first frequency,
wherein the second and third inductor elements have a plurality of inductor elements, respectively;
an inductor element closest to the first terminal pair among the second inductor elements and an inductor element closest to the second terminal pair among the third inductor elements are arranged further away from the first inductor element than the other inductor elements included in the second and third inductor elements;
the first to third inductor elements and the first and second filters are formed on the same substrate;
the first inductor element and the inductor element formed closest to the first terminal pair among the second inductor elements are arranged opposite to each other by sandwiching the first filter; and
the first inductor element and the inductor element formed closest to the second terminal pair among the third inductor elements are arranged opposite to each other by sandwiching the second filter.

9. The portable phone according to claim 8,
wherein the first filter has:
a first serial resonator formed by using a first plurality of series piezoelectric thin film resonators; and
a first parallel resonator formed by using a first plurality of parallel piezoelectric thin film resonators,
the second filter has:
a second serial resonator formed by using a second plurality of series piezoelectric thin film resonators; and
a second parallel resonator formed by using a second plurality of parallel piezoelectric thin film resonators,
the second inductor elements are connected to the first serial resonator or the first parallel resonator, and
the third inductor elements are connected to the second serial resonator or the second parallel resonator.

10. The portable phone according to claim 9,
wherein the second inductor elements are connected in series to the first parallel resonator, and resonate in series with an impedance of the first parallel resonator by the second frequency; and
the third inductor elements are connected in series to the second parallel resonator, and resonate in series with an impedance of the second parallel resonator by the first frequency.

11. The portable phone according to claim 9,
wherein the second inductor elements are connected in series to the first serial resonator, or connected in parallel to the first serial resonator, or connected in series to the first parallel resonator, or connected in parallel to the first parallel resonator, and
the third inductor elements are connected in series to the second serial resonator, connected in parallel to the second serial resonator, or connected in series to the second parallel resonator, or connected in parallel to the second parallel resonator.

12. The portable phone according to claim 8,
wherein the first filter is configured to extract a signal with the frequency bandwidth including the first frequency included in a signal inputted to the common signal terminal pair to output the extracted signal from the first terminal pair or configured to extract a signal with frequency bandwidth including the first frequency included in a signal inputted to the first terminal pair to output the extracted signal from the common signal terminal pair; and
the second filter is configured to extract a signal with the frequency bandwidth including the second frequency included in a signal inputted to the common signal terminal pair to output the extracted signal from the second terminal pair or configured to extract a signal with frequency bandwidth including the second frequency included in a signal inputted to the second terminal pair to output the extracted signal from the common signal terminal pair.

\* \* \* \* \*